(12) United States Patent
Tanaka et al.

(10) Patent No.: US 9,093,890 B2
(45) Date of Patent: Jul. 28, 2015

(54) LINEAR MOTOR, MOVABLE STAGE AND ELECTRON MICROSCOPE

(75) Inventors: Hideki Tanaka, Hitachinaka (JP); Masahiro Koyama, Tsuchiura (JP); Masaki Mizuochi, Hitachinaka (JP); Hiroshi Tsuji, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/489,522

(22) Filed: Jun. 6, 2012

(65) Prior Publication Data

US 2012/0305766 A1 Dec. 6, 2012

(30) Foreign Application Priority Data

Jun. 6, 2011 (JP) ................................. 2011-125930

(51) Int. Cl.
*H01J 37/20* (2006.01)
*H02K 41/03* (2006.01)
*H02K 41/035* (2006.01)
*H01J 37/28* (2006.01)
*H02K 1/02* (2006.01)
*H02K 1/17* (2006.01)

(52) U.S. Cl.
CPC ............ *H02K 41/0356* (2013.01); *H01J 37/20* (2013.01); *H01J 37/28* (2013.01); *H02K 41/031* (2013.01); *H01J 2237/0264* (2013.01); *H01J 2237/20228* (2013.01); *H02K 1/02* (2013.01); *H02K 1/17* (2013.01)

(58) Field of Classification Search
CPC ... H02K 5/02; H02K 41/031; H02K 11/0005; H01J 37/09; H01J 37/20; H01J 2237/20228; H01J 2237/202; H01J 2237/20278; H01J 2237/0264

USPC ................... 250/442.11; 310/12.18
See application file for complete search history.

(56) References Cited

U.S. PATENT DOCUMENTS

| | | | |
|---|---|---|---|
| 6,521,891 B1* | 2/2003 | Dotan et al. | 250/310 |
| 6,730,916 B1* | 5/2004 | Tsuji et al. | 250/442.11 |
| 7,382,440 B2* | 6/2008 | Tegenbosch | 310/12.06 |
| 2003/0155820 A1* | 8/2003 | Tominaga et al. | 310/12 |
| 2008/0001483 A1* | 1/2008 | Kitamura et al. | 310/12 |

(Continued)

FOREIGN PATENT DOCUMENTS

| | | |
|---|---|---|
| JP | 61-054861 | 3/1986 |
| JP | 2001-008431 | 1/2001 |

(Continued)

OTHER PUBLICATIONS

JP Office Action for Japanese Application No. 2011-125930, issued on Jul. 17, 2013.

*Primary Examiner* — Jack Berman
*Assistant Examiner* — Wyatt Stoffa
(74) *Attorney, Agent, or Firm* — Baker Botts L.L.P.

(57) ABSTRACT

It is an object to balance suppression of a leakage magnetic field and driving performance. In a linear motor including a stator including a first yoke having an open face and two rows of permanent magnets linearly arrayed inside the first yoke so that S-poles and N-poles are alternate and a movable element arranged between the two rows of permanent magnets and linearly moving, a second yoke is connected to an open end of the first yoke so as to cover the open end of the first yoke and the permanent magnets when viewed from the open face of the first yoke.

8 Claims, 6 Drawing Sheets

(56) References Cited

U.S. PATENT DOCUMENTS

2008/0260517 A1* 10/2008 Hayashigaito et al. ......... 415/68
2011/0109895 A1* 5/2011 Homma ....................... 310/90.5
2012/0145920 A1* 6/2012 Ogawa et al. ............ 250/442.11

FOREIGN PATENT DOCUMENTS

| JP | 2001-286120 | 10/2001 |
| JP | 2002-191164 | 7/2002 |
| JP | 2010-177005 | 8/2010 |

* cited by examiner

LINEAR MOTOR, MOVABLE STAGE AND ELECTRON MICROSCOPE

CLAIM OF PRIORITY

The present application claims priority from Japanese patent application serial No. 2011-125930 filed on Jun. 6, 2011, the content of which is hereby incorporated by reference into this application

BACKGROUND OF THE INVENTION

1. Field of the Invention

The present invention relates to a linear motor, a movable stage and an electron microscope.

2. Description of the Related Art

In an electron microscope, it is common to move an imaging object using a movable stage and to image the imaging object at a variety of positions. Because high speed move and highly precise positioning of the movable stage are required, a linear motor is used as a drive source for the movable stage. However, in the electron microscope, magnetic field variation on an electron orbit should be reduced. Therefore, magnetic field variation caused by movement of the movable stage should also be reduced.

In the linear motor, the driving force is an electromagnetic force generated between a coil energized by control current and permanent magnets. A moving coil type that is common in the liner motor includes a stator having a row of permanent magnets arrayed in a rail shape and a movable element having coils energized by the control current. The length of the stator in the moving direction of the movable element is generally equal to the moving stroke of the movable element.

When a linear motor is used for a movable stage of an electron microscope, if the stator is fixed, magnetic field variation can be suppressed. However, as a movable stage with less number of parts, such a configuration of moving the stator is also possible. In the configuration, because magnetic field variation on an electron orbit occurs due to movement of the stator, the magnetic field variation should be suppressed. Also, in order to increase the driving performance, weight reduction of the stator is also required.

In Japanese Unexamined Patent Application Publication No. 2002-354779 for example, a linear motor is disclosed in which an end of a yoke is folded in an L-shape toward the surface of an armature coil so as to cover an end of permanent magnets. With the configuration, leakage flux from a motor can be reduced.

However, in the linear motor described in Japanese Unexamined Patent Application Publication No. 2002-354779, no consideration is given to that there is an individual variation on the magnitude of a leakage magnetic field of a stator. That is, because a same stator yoke is used although acceptable amount of the leakage magnetic field is different in each device, there is a problem that the weight of the stator becomes heavy unnecessarily.

An object of the present invention is to balance suppression of the leakage magnetic field and the driving performance.

SUMMARY OF THE INVENTION

In order to achieve the object, the present invention provides a linear motor including a stator including a first yoke having an open face and two rows of permanent magnets linearly arrayed inside the first yoke so that S-poles and N-poles are alternate and a movable element arranged between the permanent magnets in two rows and linearly

2 moving, in which a second yoke is connected to an open end of the first yoke so as to cover the open end of the first yoke and the permanent magnets when viewed from the open face of the first yoke.

According to the present invention, suppression of the leakage magnetic field and the driving performance can be balanced.

DETAILED DESCRIPTION OF THE PREFERRED EMBODIMENTS

Below, preferred embodiments of the present invention will be described using embodiments illustrated.

[First Embodiment]

Figure 1:
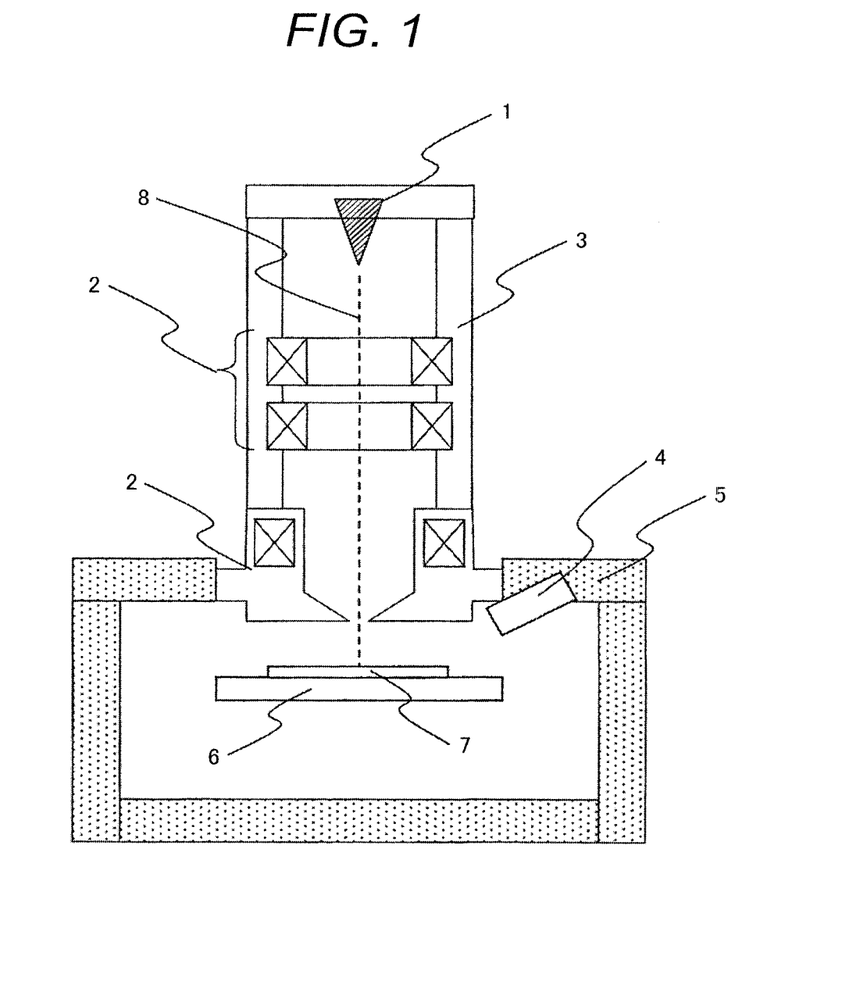
FIG. 1 is a schematic configuration drawing of an electron microscope.

In FIG. 1, a schematic configuration of an electron microscope which is common to respective embodiments is shown. The electron microscope has a function of deflecting and focusing electrons emitted from an electron gun 1 with electron lenses 2 and irradiating them to a predetermined area of a sample 7. The positional relation of an electron beam and the sample 7 is roughly adjusted by a sample stage 6. Also, the electron beam is deflected by the electron lenses 2, and various portions of the sample 7 are inspected or imaged. Further, a primary electron orbit 8 illustrates an orbit when the electron lenses 2 do not deflect the electron beam. From the surface of the sample 7 where the electron beam has been irradiated, reflected electrons and secondary electrons are emitted. Out of them, the electron microscope captures the secondary electrons with a secondary electron detector 4.

A linear motor can be applied as a drive source for the sample stage 6. However, attention should be paid to the leakage magnetic field from the linear motor. The reason is that the magnetic field variation on an electron orbit bends the electron beam and causes positioning shift and focus offset in imaging.

Figure 2:
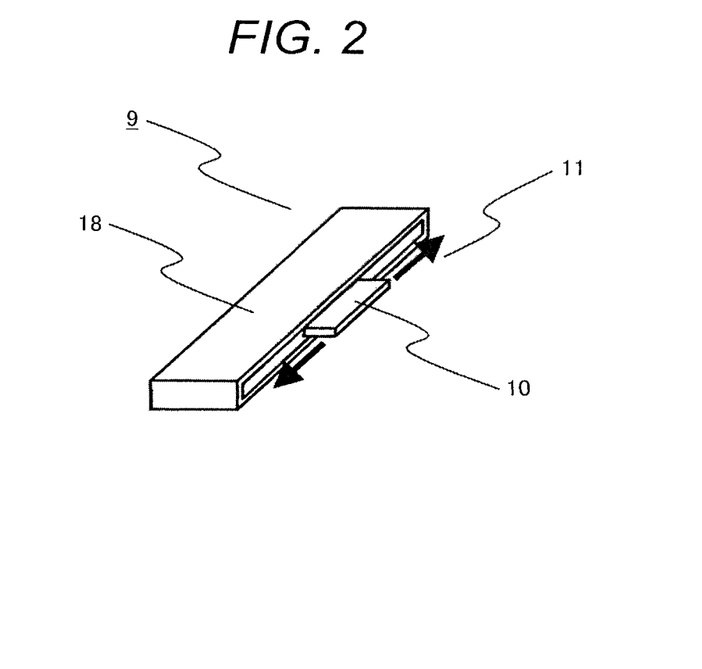
FIG. 2 is a schematic view of a moving-coil type linear motor.

In FIG. 2, a schematic view of a moving-coil type linear motor is shown. A stator 9 includes two rows of permanent magnets arrayed linearly and a yoke (first yoke) 18 in a shape surrounding the rows of the permanent magnets, and a movable element 10 includes a coil (not shown). The movable element 10 is moved and positioned by an interaction between a magnetic field formed by the rows of the permanent magnets and a magnetic field formed by the coil inside the movable element.

Because the yoke cannot be arranged at a position interfering movement of the movable element, an open face is partly necessary in the stator (yoke). The leakage magnetic field from the stator is derived mainly from presence of the open face in the stator.

Figure 3:
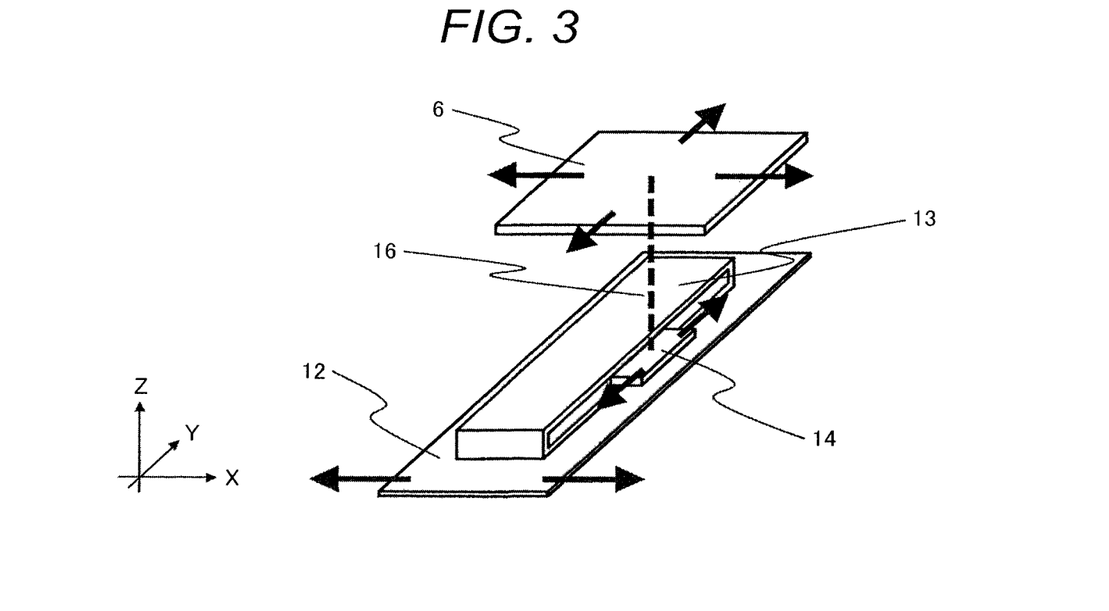
FIG. 3 is a configuration example of a movable stage.

In FIG. 3, a configuration example of a movable stage using a linear motor is shown. The movable stage includes the sample stage 6 movable in two axial directions of x and y directions. As the drive source of the sample stage 6, at least one unit of the linear motor is required for movement in each of one axial direction of x and y directions. In FIG. 3, a first linear motor (not shown) moving an intermediate stage 12 in x direction and a second linear motor (stator 13, movable element 14) fixed to the intermediate stage 12 are used. Because the linear motor movable element 14 on the intermediate stage 12 moving in y direction is fixed to the sample stage 6 by a connecting unit 16, the sample stage 6 can move in two axial directions. At this time, the linear motor stator 13 on the intermediate stage moves in x direction.

A magnetic field leaks from the linear motor stator 13 on the intermediate stage. Therefore, in the configuration of FIG. 3, the magnetic field distribution varies with movement of the sample stage 6 in a space around the stage including the electron orbit. Although the magnetic field variation can be suppressed by moving the stator 13 away from the sample stage 6, a sample chamber container 5 should be enlarged at that rate. Therefore, it is necessary to suppress the leakage magnetic field from the stator 13 without enlarging the sample chamber.

Figure 4A:
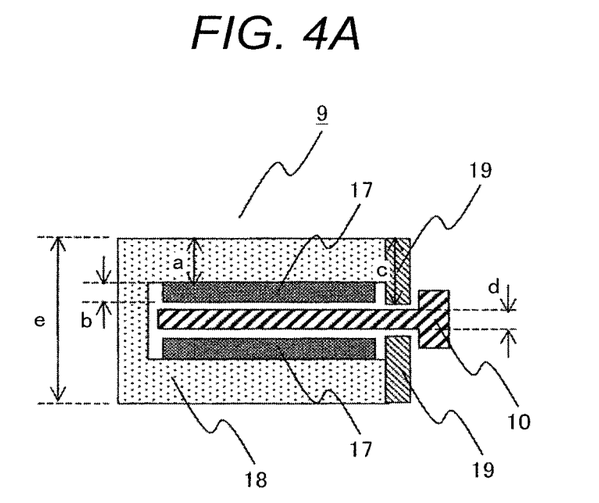
FIG. 4A is a linear motor schematic cross-sectional view and FIG. 4B is a separate member yoke attaching schematic view in a first embodiment.

In FIG. 4A, a linear motor schematic cross-sectional view in a first embodiment are shown. And in FIG. 4B, a separate member yoke attaching schematic view in a first embodiment are shown. Description will be made by a cross section (x-z plane in FIG. 4B) orthogonal to the moving direction (y direction in FIG. 4B) of the movable element 10. Permanent magnets 17 are arranged on opposed two faces which are inner surfaces of the yoke 18 with a U-shape cross section. A coil section of the movable element 10 is inserted between the permanent magnets 17. Because this alone is not sufficient to prevent leakage of the magnetic field, a yoke (second yoke) 19 of a separate member is connected to an open end of the yoke 18 so as to cover the permanent magnets 17 and the open end of the yoke 18 when viewed from the open face of the yoke 18. It is preferable that the yoke 19 of the separate member has the length equal to the length of the yoke 18.

As shown in FIG. 3, x direction is termed as a height, y direction is termed as a length, and z direction is termed as a thickness.

In FIG. 4A, the relation of a thickness a of a wall on both sides of the yoke 18, a thickness b of the permanent magnets 17, a thickness c of the yoke 19 of the separate member, a thickness d of the coil section of the movable element 10, and a thickness e of a wall of a side of the yoke 18 is to be a+b≤c and 2c+d<e. With a+b≤c, the leakage magnetic field from the open face of the yoke 18 can be suppressed. When a+b<c, the leakage magnetic field can be suppressed further. When the movable element 10 is to interfere with the yoke 19, interference can be avoided by making the thickness of the movable element partly thin and the like. With 2c+d<e, the movable element 10 does not touch the yoke 19 of the separate member when the movable element 10 moves linearly. It is appropriate that the yoke 19 of the separate member is made of a raw material the same as that of the yoke 18.

Figure 4B:
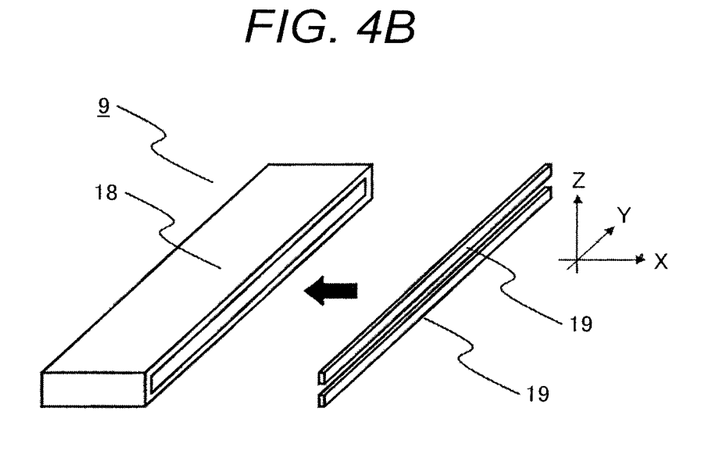

The present embodiment shows a case in which the yoke 19 of the separate member is of two plates of a linear shape. As an example, when the height of the yoke 18 was made approximately 70 mm, the length was made approximately 800 mm, the thickness was made approximately 30 mm, and the yoke 19 of the separate member with the height of approximately 5 mm was arranged, it was confirmed that the leakage magnetic field from the stator 9 could be suppressed to approximately ¼ compared to the case there was no yoke 19 of the separate member.

There is an individual variation on the magnitude of the leakage magnetic field from the stator 9. It is mainly due to that polarization of the permanent magnets varies. Accordingly, the magnitude of the leakage magnetic field also varies according to the permanent magnet, and therefore the yoke amount required for making the magnitude of the leakage magnetic field fall within a standard varies. Because excessive addition of the yoke increases the weight of the stator 9, in a stage configuration where the stator 9 also moves, driving performance of the stage deteriorates.

Accordingly, as the present embodiment, by making the yoke for suppressing the leakage magnetic field the yoke 19 of the separate member, it becomes possible to impart selectivity to the thickness of the yoke and to balance suppression of the leakage magnetic field and the driving performance appropriately according to the permanent magnets.

Also, it is allowable that the permanent magnets 17 and the yoke 19 of the separate member are in contact with each other. Further, the yoke 19 of the separate member may not necessarily be of a raw material the same as that of the yoke 18 as far as it is a material generally called a ferromagnetic substance. By manufacturing the yoke 19 of the separate member of a raw material different from that of the yoke 18, the balance of the weight and volume of the yoke 19 of the separate member and the suppression degree of the leakage magnetic field can be finely adjusted.

As methods for arranging the yoke 19 of the separate member onto the yoke 18, adhesion utilizing a magnetic force, adhesion by an adhesive accommodating vacuum, screwing and the like can be cited.

In the present embodiment, a configuration in which the open face of the yoke was turned sideways was shown, however other configurations are also possible in which the open face of the yoke is turned vertically upward or downward.

[Second Embodiment]

Figure 5A:
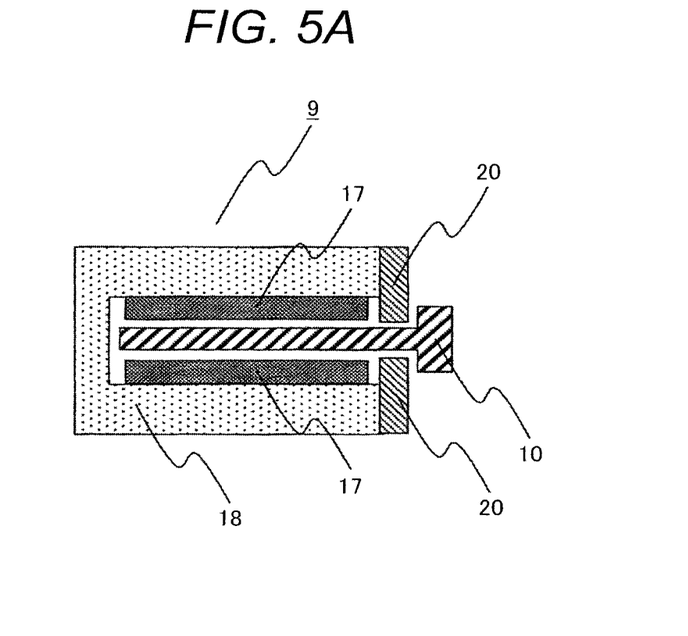
FIG. 5A is a linear motor schematic cross-sectional view and FIG. 5B is a separate member yoke attaching schematic view in a second embodiment.

In embodiments shown below, only the points different from the first embodiment will be described. In FIG. 5A, a linear motor schematic cross-sectional view in a second embodiment are shown. And in FIG. 5B, a separate member yoke attaching schematic view in a second embodiment are shown.

Figure 5B:
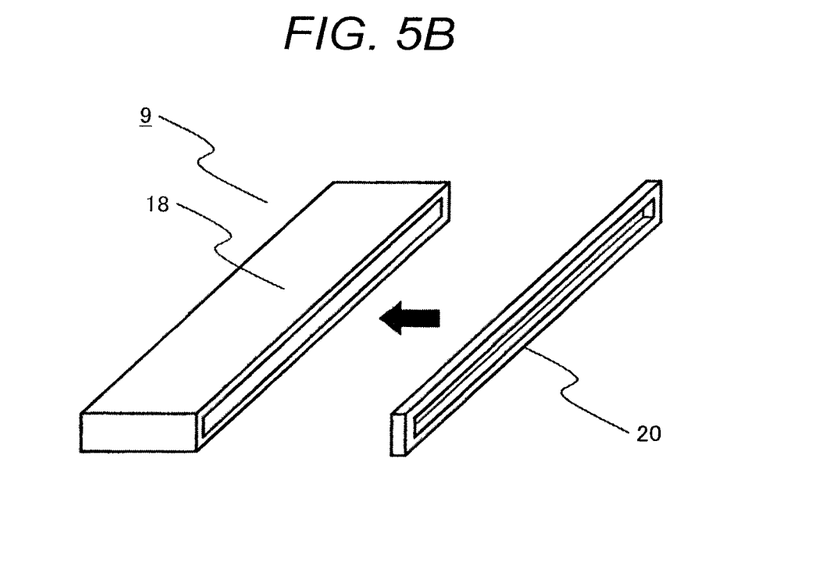

A yoke of a separate member is attracted to the yoke 18 by a magnetic force. Therefore, by making a yoke 20 of a separate member a square shape surrounding entire periphery of the open end of the yoke 18 as done in the present embodiment, adjustment of the installation position becomes easy, and interference with the movable element 10 can be surely avoided. That is, unlike the case of the first embodiment in which the yoke 19 is of two separate parts, adjustment work for arranging the two parts in parallel is unnecessary. Further, in order to improve accuracy of the installation position, it is also possible to form a recess in the yoke 18 and to form a projection (pin for example) capable of being fit into the recess in the yoke 20 of the separate member.

[Third Embodiment]

Figure 6A:
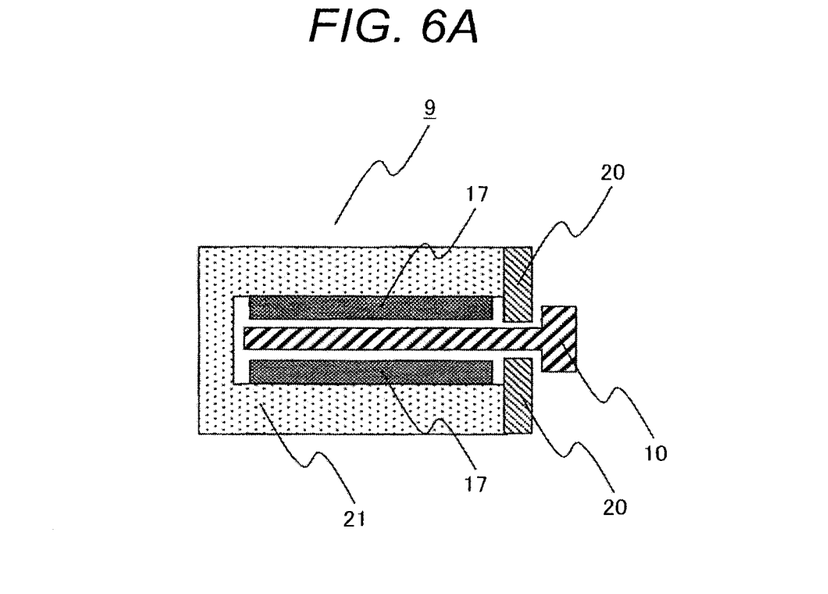
FIG. 6A is a linear motor schematic cross-sectional view and FIG. 6B is a separate member yoke attaching schematic view in a third embodiment.

In FIG. 6A, a linear motor schematic cross-sectional view in a third embodiment are shown. And in FIG. 6B, a separate member yoke attaching schematic view in a third embodiment are shown.

Figure 6B:
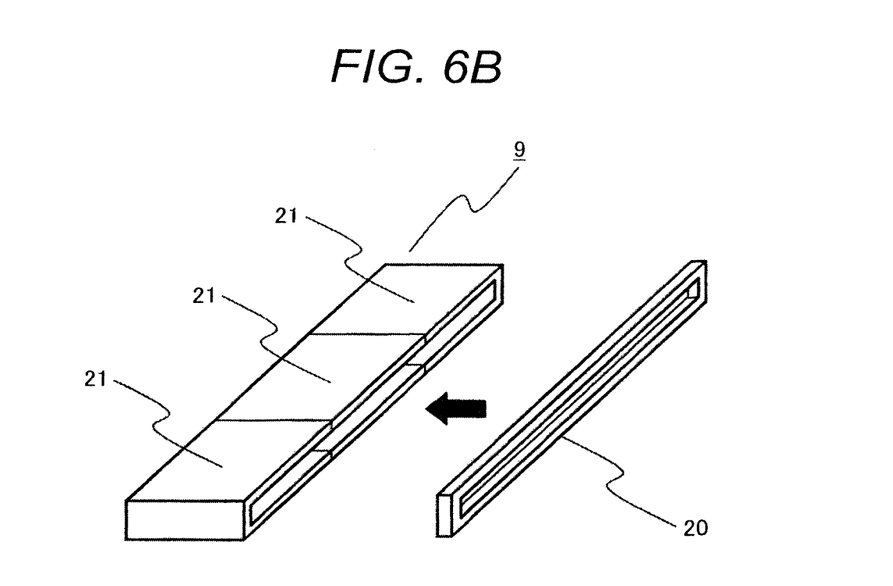

In the present embodiment, a case is shown in which three split type yokes 21 are connected in the moving direction of the movable element. In order to enlarge an imaging object of an electron microscope, it is necessary to extend the moving stroke of the movable stage, that is to extend the length of the stator. It is also possible to manufacture one long stator, however a stator with a long stroke can be manufactured at a low cost by connecting a plurality of stators of a standard length.

When a plurality of the split type yokes 21 are connected and used as shown in the third embodiment, linearity in connecting the split type yokes 21 is important. By using the yoke of the separate member 20 of a square shape as a guide in connecting, linearity in connection can be improved. Also, the yoke of the separate member of a square shape was shown in the present embodiment, however other shape is also possible.

[Fourth Embodiment]

Figure 7A:
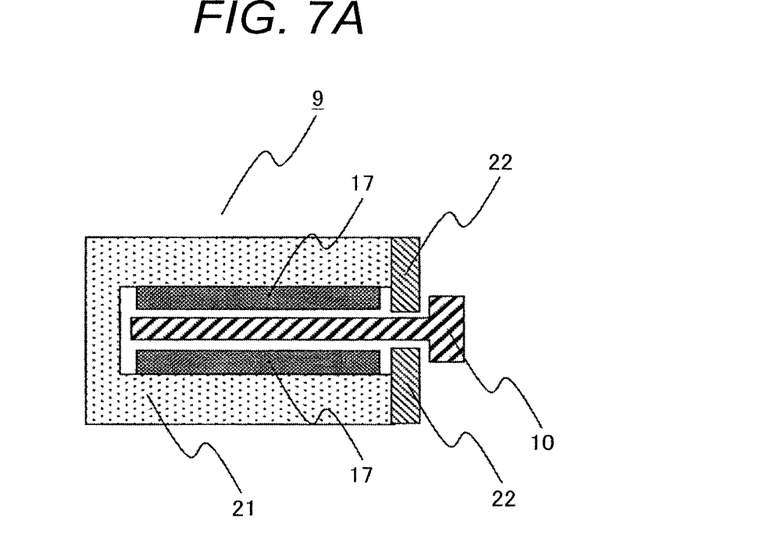
FIG. 7A is a linear motor schematic cross-sectional view and FIG. 7B a separate member yoke attaching schematic view in a fourth embodiment.

In FIG. 7A, a linear motor schematic cross-sectional view in a fourth embodiment are shown. And in FIG. 7B, a separate member yoke attaching schematic view in a fourth embodiment are shown.

Figure 7B:
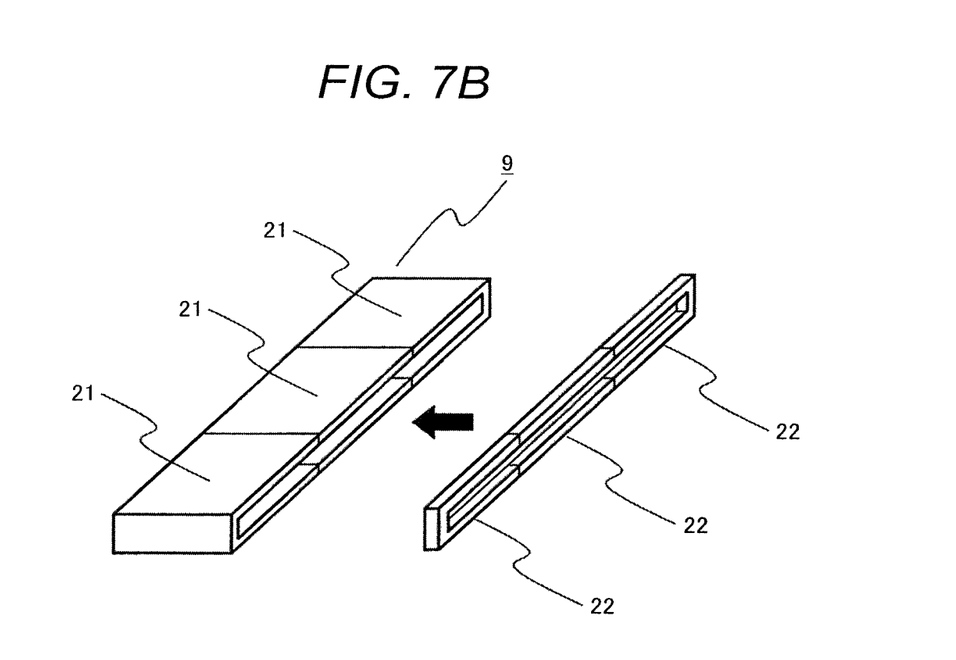

When the split type yokes 21 are connected and used as shown in the third embodiment, there may be an individual variation on the magnitude of a leakage magnetic field of the split type yokes 21. In this case, the leakage magnetic field suppression performance of the yoke 19 of the separate member required for the respective split type stators varies.

Therefore, by using a yoke 22 of a square shape formed of separate members and having a distribution in magnetic permeability, suppression of the leakage magnetic field can be finely adjusted. As a method for making the yoke 22 of a square shape formed of separate members and having a distribution in magnetic permeability have the distribution in magnetic permeability, changing the amount of the ferromagnetic substance contained, formation by a separate material and the like can be cited. In this case, the yoke 22 of a square shape formed of separate members and having a distribution in magnetic permeability should be an integral object mechanically.

What is claimed is:

1. A linear motor comprising:
 a stator including a first yoke made of ferromagnetic substance and having an open face and two rows of permanent magnets linearly arrayed inside the first yoke so that S-poles and N-poles are alternate; and
 a moveable element arranged between the two rows of permanent magnets and linearly movable in a moving direction;
 the stator is constructed by connecting a plurality of separated stators along with the moving direction of the movable element;
 the two rows of permanent magnets are provided from an opening face of the open face of the first yoke and spaced apart from each other in a direction perpendicular to the moving direction of the movable element;
 a second yoke made of ferromagnetic substance and in a form of two stick-shaped members and/or a plate member in a square shape surrounding an entire periphery of an open end of the first yoke and provided along the connecting direction of the separated stators, wherein the stick members and/or the plate member and the two rows of permanent magnets are provided to face each other at the open end of the first yoke selectively to provide a smaller opening space than the opening space of the open face of the first yoke, in a direction perpendicular to the moving direction of the movable element, wherein the first yoke and the second yoke are connected by an adhesive connecting member, or a magnetic force from each other.

2. The linear motor according to claim 1, wherein magnetic permeability of the second yoke is different from that of the first yoke.

3. The linear motor according to claim 1, wherein the second yoke has a distribution of magnetic permeability in the moving direction of the movable element.

4. A movable stage comprising:
 the linear motor according to claim 1; and
 a sample stage fixed to the movable element through a connecting unit.

5. An electron microscope comprising:
 the movable stage according to claim 4;
 an electron gun;
 electron lenses deflecting a focusing electrons emitted from the electron gun; and
 a secondary electron detector detecting secondary electrons emitted from a sample where the electrons have been irradiated.

6. The linear motor according to claim 1, wherein the second yoke is positioned around an entire periphery of an open end of the first yoke by a positioning member.

7. A linear motor comprising:
 a stator including a U-shaped first yoke made of ferromagnetic substance, the first yoke having an opening of a same cross-sectional size as a cavity of the first yoke so that the cavity is fully exposed via the opening of the first yoke, the stator further having a permanent magnetic line linearly arrayed inside the cavity of the first yoke so that S-poles and N-poles are alternate; and
 a movable element extending through the opening and arranged between the two rows of permanent magnets, and linearly movable in a moving direction;
 the stator is constructed by connecting a plurality of separated stators along with the moving direction of the movable element;
 a second yoke made of ferromagnetic substance, where the second yoke is provided only on a cavity-facing side of the first yoke and in a form of a plate member having an O-shape surrounding an entire periphery of the cavity-facing side of the first yoke, the O-shape including a smaller opening than the opening of the cavity in a direction perpendicular to the moving direction of the movable element, to have the moveable element extending through and movable along the smaller opening, wherein the plate member and the permanent magnet line are provided to face each other at the opening of the first yoke, wherein the first yoke and the second yoke are directly connected together.

8. A linear motor comprising:
 a stator including a U-shaped first yoke made of ferromagnetic substance, the first yoke having an opening of a same cross-sectional size as a cavity of the first yoke so that the cavity is fully exposed via the opening of the first yoke, the stator further having two rows of permanent magnets linearly arrayed inside the cavity of the first yoke so that S-poles and N-poles are alternate; and
 a movable element arranged between the two rows of permanent magnets and linearly movable in a moving direction;
 the stator is constructed by connecting a plurality of separated stators along with the moving direction of the movable element;
 a second yoke made of ferromagnetic substance, where the second yoke is provided only on a cavity-facing side of the first yoke and in a form of two stick-shaped members, wherein the stick members and the two rows of permanent magnets are provided to face each other at the cavity-facing side of the first yoke, to provide a smaller opening therebetween than the opening of the cavity in a direction perpendicular to the moving direction of the movable element, to have the moveable element extending through and movable along the smaller opening, wherein the first yoke and the second yoke are connected together.

* * * * *